United States Patent [19]
Hirose et al.

[11] Patent Number: 5,946,329
[45] Date of Patent: Aug. 31, 1999

[54] VITERBI DECODING METHOD AND VITERBI DECODER

[75] Inventors: Toshihiko Hirose, Kanagawa; Hiroyuki Ino, Chiba, both of Japan

[73] Assignee: Sony Corporation, Tokyo, Japan

[21] Appl. No.: 08/786,209

[22] Filed: Jan. 21, 1997

[30] Foreign Application Priority Data

Jan. 24, 1996 [JP] Japan ..................................... 8-010367

[51] Int. Cl.$^6$ ..................................................... G06F 11/10
[52] U.S. Cl. ............................. 371/43.7; 371/44; 371/45; 371/46; 262/341; 369/59; 375/265
[58] Field of Search ............................... 371/43.7, 43, 45, 371/44, 46; 364/702, 723, 569, 577; 369/59, 13; 375/265, 266; 262/341; 704/242

[56] References Cited

U.S. PATENT DOCUMENTS 4,653,374   3/1987   Iba ........................................... 84/1.01
5,341,387   8/1994   Nuguyen ................................... 371/45
5,488,591   1/1996   Kobayashi et al. ...................... 369/13
5,602,858   2/1997   Kitaori .................................... 371/13

FOREIGN PATENT DOCUMENTS 0 680 184 A2   11/1995   European Pat. Off. ........ H04L 27/34

*Primary Examiner*—Reba I. Elmore
*Assistant Examiner*—McDieunel Marc
*Attorney, Agent, or Firm*—Frommer Lawrence & Haug, LLP.; William S. Frommer

[57] ABSTRACT

A Viterbi decoding method and decoder are provided for achieving a faster operation than the prior art. The Viterbi decoding method and decoder are arranged to determine the most approximate path on two-state state metrics and decode the data on the most approximate path. The Viterbi decoder includes registers 2 and 3 for reading two pieces of sample data, an adder 14 for adding two pieces of sample data read by the registers 2 and 3, and an arrangement located after the adder 14 for determining a path of each state transition by comparing the added result with a given identification of −1, 0 or 1.

8 Claims, 11 Drawing Sheets

VITERBI DECODING METHOD AND VITERBI DECODER

BACKGROUND OF THE INVENTION

1. Field of Industrial Application

The present invention relates to a Viterbi decoding method and a Viterbi decoder which are executed to determine the most approximate path on two-state state metrics.

2. Description of the Related Art

The Viterbi decoding has been known for the maximum likelihood decoding system for partial responses or convolution codes. The Viterbi decoding system provides a high error-correcting capability for a random error caused on a transmission path, so that the Viterbi decoding system is combined with a partial response when it is used in a data recording and reproducing system. For the data communication system, the Viterbi decoding system is now being applied as a method for decoding convolution codes to satellite communications.

Herein, the description will be oriented to a commonly available data recording and reproducing apparatus which is arranged to allow controllable intra-code interference and combine the Viterbi decoding system with the partial response with higher transmission efficiency.

As shown in FIG. 1, a numeral 101 denotes a modulator, which serves to modulate the data into a proper format to a recording medium 104, for example, through the effect of the eight-to-ten modulation. Concretely, the modulator 101 serves to convert the data entered as information series (simply termed the information series) at a terminal 171 into modulated series xt (t=0. 1. 2 . . . ).

A numeral 102 denotes a pre-coder for the partial responses. The pre-coder 102 serves to code the modulated series xt according to the predetermined coding rules for generating medium series yt. The medium series yt are transmitted to a recording head through a recording amplifier 103 and then is recorded on the recording medium 104 through the recording head. As a result of the abovementioned process, the data (information series) entered at the terminal 171 has been recorded on the recording medium 104.

A signal reproduced from the recording medium 104 through a reproduction head is amplified by a reproduction amplifier 105 and then is transmitted to an equalizer 106. The equalizer 106 operates to equalize the waveform of the reproduced signal and then feed an output z onto a transmission path.

A numeral 107 denotes a phase-locked loop (termed PLL) circuit, which operates to extract clock components from the output z on the transmission path having the recording medium 104 on the way. That is, the PLL circuit 107 operates to generate a clock synchronized with the reproduced signal.

A numeral 108 denotes a sampling circuit, which operates to sample the output z for the transmission path on the clock sent from the PLL circuit 107 for converting the output z into data and then supply the resulting sampling series zt to a Viterbi decoder. 109. The Viterbi decoder 109 operates to perform the Viterbi decoding with respect to the sampling series zt and reproduce the modulated series xt for the output of the modulator 101 of the recording system.

A numeral 110 denotes a decoder, which is located to correspond to the modulator 101 of the recording system and operates to demodulate the modulated series xt for reproducing the original information series and then feed the reproduced information series as the decoded series through a terminal 172. These series of operations result in reproducing the data from the recording medium 104.

In turn, the description will be oriented to a transmission system in which the used partial response is (1, 1) (simply termed PR(1, 1)).

The transmission system having PR(1, 1) applied thereto may be represented by the equalizer circuit shown in FIG. 2.

Concretely, this transmission system provides a precoder for PR(1, 1) as its transmitting system. This pre-coder is composed of an exclusive-Or circuit (termed the EXOR circuit) 121 and a delaying unit 122 for delaying the medium series yt that are an output of the EXOR circuit 121 and supplying the delayed signal to the EXOR circuit 121.

The EXOR circuit 121 takes an EXOR of the modulated series xt supplied from the modulator 101 shown in FIG. 1 through the terminal 173 and the medium series yt delayed by a sampling time point by a delaying unit 122. That is, the precoder composed of the EXOR circuit 121 and the delaying unit 122 is served as a Modulo-2 adder (termed the Mod-2 adder). The pre-coder performs a Mod-2 addition with respect to the modulated series xt for generating the medium series yt and then feed the medium series yt onto the transmission path.

The transmission path for PR(1, 1) is equivalent to the circuit composed of the delaying unit 123 for delaying the medium series yt and the adder 124 for adding the medium series yt to the medium series yt-delayed by the delaying unit 123. The delaying unit 123 operates to delay the medium series yt from the EXOR circuit 121 by one sampling time. The adder 124 operates to add the medium series yt to the delayed medium series yt and then feed the output z onto the transmission path.

In the receiving system, the Mod-2 adder 125 performs a modulo-2 addition with respect to the output z for reproducing the modulated series xt. The operation of the Mod-2 addition results in reproducing the modulated series xt and feeding xt through the terminal 174.

The operation of the circuit (termed the PR(1, 1) circuit) covering the range of the EXOR circuit 121 to the adder 124 may be represented by a state transition diagram of FIG. 3.

Concretely, FIG. 3 shows the state transition of PR(1, 1). In the state transition of FIG. 3:

$1_{00}$ means that if a value of "0" is entered as an information source in the state S0, a value of "−1" is output and the state is shifted to the state S0;

$1_{01}$ means that if a value of "1" is entered as an information source in the state S0, a value of "0" is output and the state is shifted to the state S1;

$1_{10}$ means that if a value of "0" is entered as an information source in the state S1, a value of "+1" is output and the state is shifted to the state S1; and $1_{11}$ means that if a value of "1" is entered as an information source in the state S1, a value of "0" is output and then the state is shifted to the state S0.

Next, FIG. 4 is a Trellis diagram in which the state transition is expanded on the time point bases. In this diagram, an arrow from a state to another one is termed a branch, a bunch of branches is termed a path, and a likelihood of each branch is termed a metric.

As is understood from the state transition diagram, in PR(1, 1), when an input signal to the decoder is zero, the reproduced data takes a value of 1. When an input signal is ±1, the reproduced data takes a value of 0. The actual signal involves noises. Assuming that the distribution is a Gaussian distribution having a dispersion of σ and an average value of 0, the reproduction distribution of PR(1, 1) is made to be as shown in FIG. 5, so that the probabilities of the following expressions (1) to (4) may be derived.

[Expression 1]

$$P_{11} = \frac{\Delta y}{\sqrt{2\Delta\pi\sigma}} e^{-\frac{y_k^2}{2\sigma^2}} \quad (1)$$

$$P_{10} = \frac{\Delta y}{\sqrt{2\Delta\pi\sigma}} e^{-\frac{(y_k-1)^2}{2\sigma^2}} \quad (2)$$

$$P_{01} = \frac{\Delta y}{\sqrt{2\Delta\pi\sigma}} e^{-\frac{y_k^2}{2\sigma^2}} \quad (3)$$

$$P_{00} = \frac{\Delta y}{\sqrt{2\Delta\pi\sigma}} e^{-\frac{(y_k+1)^2}{2\sigma^2}} \quad (4)$$

The expression (1) indicates a probability $P_{11}$ of sensing $\Delta y$ when a value of "1" is reproduced in the state S1. The expression (2) indicates a probability $P_{10}$ of sensing $\Delta y$ when a value of "0" is reproduced in the state S1. The expression (3) indicates a probability $P_{01}$ of sensing $\Delta y$ when a value of "1" is reproduced in the state S0. The expression (4) indicates a probability $P_{00}$ of sensing $\Delta y$ when a value of "0" is reproduced in the state S0.

Herein, a negative logarithm to the probability is defined as a metric.

The metric in the Viterbi decoding system is derived by the comparison of not the absolute values but the relative values. Hence, for normalizing the metric, a constant is added and multiplied to the metric. Assuming that the normalized metric is $l_{11}, l_{10}, l_{01}, l_{00}$, it may be represented as the following expressions (5) to (7).

[Expression 2]

$$l_{11} = l_{01} = y_k^2 \quad (5)$$

$$l_{10} = (y_k - 1)^2 \quad (6)$$

$$l_{00} = (y_k + 1)^2 \quad (7)$$

The Viterbi algorithm is a system of decoding data as restricting the paths to one so that the metric to each state at a time point k (termed the state metric) is made minimum. Hence, the Viterbi algorithm for PR(1, 1) is executed to determine the most approximate path on the following expressions (8) and (9) from the state metrics of the states S0 and S1 at the time point t=k derived from the Trellis diagram of FIG. 4 and the normalized metric and then to decode the data based on the determined most approximate path.

[Expression 3]

$$\Delta L_k^{S1} = \min[L_{k-1}^{S1} + l_{10}, L_{k-1}^{S0} + l_{01}] \quad (8)$$
$$= \min[L_{k-1}^{S1} + (y_k + 1)^2, L_{k-1}^{S0} + y_k^2]$$

$$\Delta L_k^{S0} = \min[L_{k-1}^{S1} + l_{11}, L_{k-1}^{S0} + l_{00}] \quad (9)$$
$$= \min[L_{k-1}^{S1} + y_k^2, L_{k-1}^{S0} + (y_k + 1)^2]$$

A→$\Delta L_k^{S0}$ is a state metric of the state S0 at the time point t=k

B→$\Delta L_k^{S1}$ is a state metric of the state S1 at the time point t=k

The actual circuit is arranged to determine the most approximate path on this metric calculation and decode the data on the most approximate path.

The arrangement for performing the operations of the expressions (8) and (9) includes an adder and a multiplier, so that it is large in circuit scale and does not have so high an operating speed as expected.

Since the PR(1, 1) has two states, the difference $\Delta L_k$ between the metrics (termed the difference metric) as indicated in the following expression (10) is utilized for simplifying the process of the expressions (8) and (9).

[Expression 4]

$$\Delta L_k = L_k^{S1} - L_k^{S0} = \min[L_{k-1}^{S1} + (y_k - 1)^2, L_{k-1}^{S0} + y_k^2] - \quad (10)$$
$$\min[L_{k-1}^{S1} + y_k^2, L_{k-1}^{S0} + (y_k + 1)^2]$$
$$= 1 - 2y_k + \min[L_{k-1} - 2y_k, -1] -$$
$$\min[L_{k-1} - 2y_k, +1]$$

Considering the expression (10), a comparison between a common term $\Delta L_k - 1 - 2y_k$ and ±1 (indicating a content in two "min [ ]" of the expression (10)) results in selecting each branch. This selecting processes are indicated in the expressions (11) to (14) and the Trellis diagram of patterns 1 to 4 (denoted as pattern1 to pattern4).

[Expression 5]

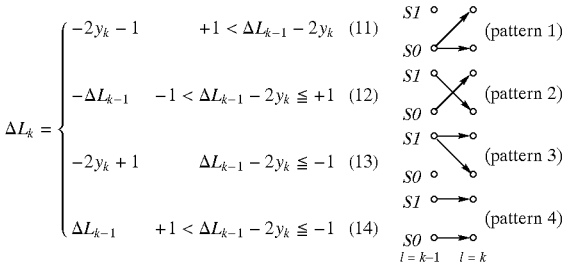

Of these patterns, the condition of the expression (14) does not permit the existence of the pattern4. The Viterbi algorithm of PR(1,1) can include only three patterns (pattern1 to pattern3) of the state transition.

Further, the expressions (11) to (13) are variable-converted with $\Delta L_k = -2y_p + \beta$. The converted expressions are made to be the following expressions (15) to (17).

[Expression 6]

$$-2y_k - 1 \quad -2y_p + 2y_k < \beta - 1 \quad (15)$$

$$+2y_k - \beta \quad \beta - 1 \leq 2y_p + 2y_k < \beta + 1 \quad (16)$$

$$-2y_k + 1 \quad \beta + 1 \leq 2y_p + 2y_k \quad (17)$$

From the calculated result of the difference metric, the transformation of the expressions (15) to (17) as remarking the new variables yp and P results in forming the following expressions (18) to (20) and the pattern1 to pattern3 as indicated in the Trellis diagram.

[Expression 7]

$\beta = +1$ or $\beta = -1$

| | | | |
|---|---|---|---|
| $y_p + y_k < 0$ | $y_p + y_k < -1$ | $\beta \to -1, y_p \to y_k$ (18) | (pattern 1) |
| $0 \leq y_p + y_k < 1$ | $-1 \leq y_p + y_k < 0$ | $\beta \to -\beta, y_p \to -y_p$ (19) | (pattern 2) |
| $1 \leq y_p + y_k$ | $0 \leq y_p + y_k$ | $\beta \to +1, y_p \to y_k$ (20) | (pattern 3) |

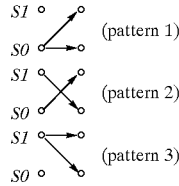

Hence, the variables yp and β before the sampling time point k makes the calculation relatively simple. Only the calculated result and the comparison of two identification values ((1, 0) or (0, −1)) make it possible to determine the path. On the determined path, the data is decoded. Then, for the next time point k+1, the variables yp and β are updated.

Now, consider these variables yp and β.

The type of the shifting direction can be grasped if the previous state is determined if it is S0 or S1, for determining the path, the identification values to be compared by one calculation are changed from three values of (±1, 0) to just one combination of two values (1, 0) or (0, 1). The type of the previous transition is represented by β. yp denotes the value at the transition. In concrete circuit arrangement, β selects two kinds of identification values (0, 1) or (0, −1).

In turn, the description will be oriented to the data decoding system. For pattern1 and pattern3, the data yk sampled at the time point k defines the state at the time point (k−1). Hence, one path up to the time point (k−1) is defined, so that the decoded data may define the values from the state transition to the time point (k−1). In this case, the state of the data at the time point k is not defined. It means that the data at the time point k cannot be defined. For pattern2, it is understood that the state transition is S0 to S1 or S1 to S0. The previous state of the pattern2 is not defined, so that one path up to the current state is not defined. From the state transition diagram of PR(1, 1), the decoded data at the time point k is "1". However, the data at the time point k−1 is not decoded. The operation is executed to keep the previous state (β) of pattern2 and the sampling value (yp) in order to decode the data when one path is defined later and store in memory the data decoded at the time point k−1 or later, before advancing to the next time. With the passage of the time, the state transitions are defined as pattern1 and pattern3, when the kept value "β" is used for defining the data at the time point before the advent of the pattern2 (the time point k−1 as mentioned above). At this time, the overall data decoding is terminated. The memory for keeping this data (termed the bus memory) is, therefore, required to provide a capacity of storing the continuous data of the pattern2 on the system.

The concrete circuit for realizing the foregoing method is considered as shown in FIGS. 6 to 8. FIG. 9 shows waveforms of portions appearing when recording the data (source data) in the recording medium 104 and reproducing the recorded data. FIG. 10 shows how the Viterbi decoder arranged as shown in FIGS. 6 to 8 decodes the data reproduced after the data is recorded as shown in FIG. 9.

At first, the description will be oriented to a concrete operation shown in FIG. 1 with reference to FIG. 9.

When the source data shown in FIG. 9 is entered to the terminal 171, the modulator 101 operates to do the eight-to-ten modulation with respect to the source data and then feed the eight-to-ten modulated data. The eight-to-ten modulated data is sent to the pre-coder 102, in which the modulated series xt are coded to the medium series yt according to the predetermined coding rules. Concretely, the pre-coder 102 uses the so-called NRZI (Non Return to Zero Inverted) system for converting the eight-to-ten modulated data into the recording signal as shown in FIG. 9, in which NRZI system the state is inverted only at the bit information of 1 when the bit information 1, 0 of the input series are recorded in correspondence to the two states (for example, N and S poles of the magnetic tape). The recording signal is sent to the recording head through the recording amplifier 103 and then is recorded on the magnetic tape as an example of a recording medium 104. When reproducing the recording medium 104 with the reproducing head, the resulting data is made to be a waveform reproduced through the head (termed the head reproduced waveform) as shown in FIG. 9. This head reproduced waveform is sent to the equalizer 106 through the reproduction amplifier 105. The equalizer 106 operates to convert the head reproduced waveform into an integrally equalized waveform as shown in FIG. 9 and then into the equalized waveform of PR(1, 1) as shown in FIGS. 9 and 10. After the equalized waveform of PR(1, 1) is sampled in the sampling circuit 108, the sampled waveform is sent to the Viterbi decoder 109 having the arrangements shown in FIGS. 6 to 8.

The difference metric operating unit shown in FIG. 6 is arranged to include a register 201 for storing as data yk the data produced by sampling the equalized waveform of PR(1, 1) shown in FIG. 10, entered through the terminal 200, an adder 202 for adding the data yk from the register 201 to the data yp stored in the register 216, a comparator 205 for comparing the output of the adder 202 with an identifying value of +1 or −1, another comparator 206 for comparing the output of the adder 202 with an identifying value of a ground level (0), an EXOR circuit 207 for performing an exclusive-OR operation of the output data from the comparators 205 and 206, a logical circuit 208 for performing an exclusive-NOR of the output data of the comparator 206 and the data β stored in the register 212, an inverter (NOT circuit) 215 for inverting the output of the register 21, an inverter (NOT circuit) 211 for inverting the output of the comparator 206, an inverter (NOT circuit) 213 for inverting the output of the register 212, a switch 217 for switching the input to the register 216, another switch 214 for switching the input to the register 212, and another switch 204 for setting a reference value (identifying value) of +1 or −1 of the comparator 205.

The terminal 200 shown in FIG. 6 receives the data produced by sampling the equalized waveform of PR(1, 1) shown in FIG. 10. The data is stored as data yk of FIG. 10 in the register 201. The data yk of this register 201 is added to the data yp from the register 216 by the adder 202 (yp+yk). In the initial state, the register 216 stores a given initial value.

The output of the adder 202 is compared with the ground level (0), concretely, is determined to be larger than (yp+yk<0) the ground level (0) in the comparator as shown in FIG. 10. The compared result is output from the comparator 206. The output of the adder 202 is compared with a value of +1 or −1 (yp+yk<±1). The compared result is output to the comparator 205.

The EXOR circuit 207 takes an exclusive-OR of the output of the comparator 205 (the data of 0 or 1 derived from the compared result of yp+yk<±1) and the output of the comparator 206 (the data of 0 or 1 derived from the compared result of yp+yk<0) as shown in FIG. 10. The calculated result is output as the data x from the terminal 209 and sent as the switching control signals to the switches 217 and 214.

The logical circuit 208 takes an exclusive-NOR of the output of the comparator 206 (the data of 0 or 1 derived from the compared result of yp+yk<0) and the data β from the register 212 as shown in FIG. 10. The calculated result is inverted by the inverter 211 and then is sent to the register 212 through the switch 214. In the initial state, the register 212 stores a given initial value.

The switch 214 is served to supply as the data β to be stored in the register 212 any one of the output data of the comparator 206 inverted by the inverter 211 and the output data of the register 212 inverted by the inverter 213 according to the data x from the EXOR circuit 207. The switch 217 is served to supply as the data yk to be stored in the register 216 any one of the output data of the register 201 and the data yp of the register 216 inverted by the inverter 215, according to the data x from the EXOR circuit 207. The switch 204 is served to select the data of +1 or −1 and supply it to the comparator 205 according to the data β of the register 212.

The terminal 200 shown in FIG. 6 receives the data produced by sampling the equalized waveform of PR(1, 1) shown in FIG. 10. The switches 217 and 214 are changed over according to the output data x of the EXOR circuit 207, while the switch 204 is changed over according to the output data β of the register 212, so that the reed data rd1 of FIG. 10 is output from the terminal 210 shown in FIG. 6.

Next, the data x output from the terminal 209 shown in FIG. 6 is supplied to the load terminal of a four-bit counter 220 of the data decoding unit. The four-bit output of this four-bit counter 220 is decoded into 16-bit data by the decoder 221 and then is output.

The reed data rd1 output from the terminal 210 shown in FIG. 6 and the data x output from the terminal 209 are sent to the bus memory unit shown in FIG. 8. In the arrangement of FIG. 8 includes 17 flip-flops $237_0$ to $237_{16}$ and switches $236_0$ to $236_{16}$ for switching the data rd1 supplied through the terminal 210 of FIG. 6 or the input data k, k−1, . . . , k−16 to each of the flop-flops $237_0$ to $237_{16}$ according to the data x sent from the terminal 209 of FIG. 6 or the data pp0 to pp15 supplied from the terminals $241_0$ to $241_{15}$ from the decoder 221 of FIG. 7.

The foregoing system advantageously provides a simplified Viterbi decoder but an ACS (Add Compare Select) loop for performing a difference metric operation shown in FIG. 6. This loop is required to be operated within one clock. However, the operating frequency of the circuit is critical. Hence, the foregoing arrangement makes it difficult to achieve a high transfer rate.

SUMMARY OF THE INVENTION

The present invention is considered to overcome the difficulty. It is an object of the present invention to provide a Viterbi decoding method and a Viterbi decoder which offer a faster operation than the conventional Viterbi decoding method and decoder.

According to an aspect of the invention, the Viterbi decoding method and decoder are arranged to take sample data every $2^n$ sampling points, perform a predetermined operation with respect to the sampling data at each $2^n$-th point, define a state transition path based on the operational result and a given identification value.

That is, conventionally, only one operation within one loop is done in one time point throttle, while according to the present invention, two or more operations within one loop can be done in one time point throttle. This improved technique of this invention enhances an operating speed higher and suppresses the amount of necessary hardware in comparison with the conventional technique.

Further objects and advantages of the present invention will be apparent from the following description of the preferred embodiments of the invention as illustrated in the accompanying drawings.

EMBODIMENTS

Figure 1:
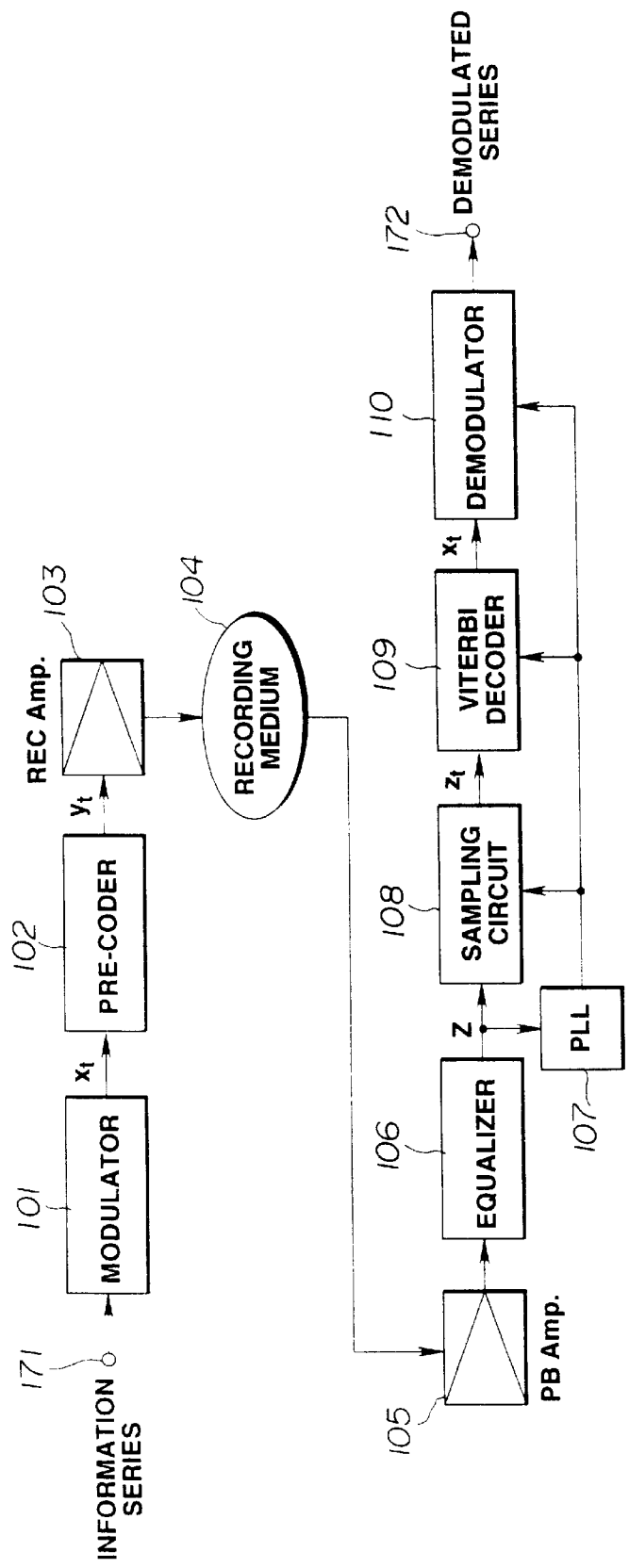
FIG. 1 is a block diagram showing an arrangement of a data recording and reproducing apparatus to which the Viterbi decoder is applied.

Later, the description will be oriented to a preferred embodiment of the present invention with reference to the drawings.

According to an embodiment of the invention, the algorithm of the Viterbi decoding method is embodied as the two-state Viterbi decoding method such as partial responses PR(1, 1) and PR(1, 0, −1) and the hardware is greatly simplified. Further, for enhancing an operating speed, the system is employed wherein the process is executed every two sampling points.

For example, keep your eyes on the path of every two sampling points illustrated in the Trellis diagram of PR(1, 1).

As the path of every two sampling points, eight paths can be considered. These paths are grouped about four state transitions of S0 to S0, S1 to S0, S0 to S1, and S1 to S1. Each state metric of these state transitions S0 to S0, S1 to S0, S0 to S1, and S1 to S1 may be represented by the following expressions (21) to (24).

[Expression 8]

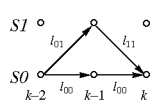

$$\Delta L_k^{S0S0} = \min[l_{00} + l_{00}, l_{01} + l_{11}] \qquad (21)$$
$$= \min[(y_{k-1} + 1)^2 + (y_k + 1)^2,$$
$$y^2_{k-1} + y^2_k]$$
$$= \min[y_{k-1} + y_k, -1]$$

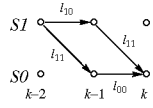

$$\Delta L_k^{S1S0} = \min[l_{11} + l_{00}, l_{10} + l_{11}] \qquad (22)$$
$$= \min[y^2_{k-1} + (y_k + 1)^2,$$
$$(y_{k-1} + 1)^2 + y^2_k]$$
$$= \min[y_{k-1} + y_k, 0]$$

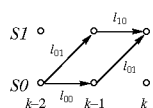

$$\Delta L_k^{S0S1} = \min[l_{00} + l_{01}, l_{01} + l_{10}] \qquad (23)$$
$$= \min[(y_{k-1} + 1)^2 + y^2_k,$$
$$y^2_{k-1} + (y_k - 1)^2]$$
$$= \min[y_{k-1} + y_k, 0]$$

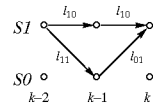

$$\Delta L_k^{S1S1} = \min[l_{10} + l_{10}, l_{11} + l_{01}] \qquad (24)$$
$$= \min[(y_{k-1} - 1)^2 + (y_k - 1)^2,$$
$$y^2_{k-1} + y^2_k]$$
$$= \min[y_{k-1} + y_k, 1]$$

$\Delta L_k^{S0,S0}$ is a state metric of the state transmission to S0→S0

$\Delta L_k^{S1,S0}$ is a state metric of the state transmission to S1→S0

$\Delta L_k^{S0,S1}$ is a state metric of the state transmission to S0→S1

$\Delta L_k^{S1,S1}$ is a state metric of the state transmission to S1→S1

From the foregoing expressions (21) to (24), it is understood that the comparison between the added result ($y_{k-1}+y_k$) between the two sampling points and the identification values (1, 0, −1) makes it possible to discriminate which of these state transitions.

In order to pick up the most approximate path, the paths are selected on each of the identification values as fixing the added result $y_{k-1}+y_k$. The picked path can be rewritten to the following expressions (25) to (32).

[Expression 9]

1  $y_{k-1} + y_k < -1$

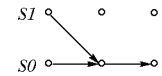

$$\Delta L_k^{S0} = \min[L_{k-2}^{S0} + (y_{k-1} + 1)^2 + (y_k + 1)^2, L_{k-2}^{S1} + y^2_{k-1} + (y_k + 1)^2] \qquad (25)$$

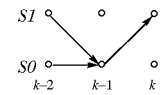

$$\Delta L_k^{S1} = \min[L_{k-2}^{S0} + (y_{k-1} + 1)^2 + y^2_k, L_{k-2}^{S1} + y^2_{k-1} + y^2_k] \qquad (26)$$

2  $-1 \leq y_{k-1} + y_k < 0$

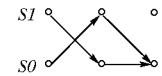

$$\Delta L_k^{S0} = \min[L_{k-2}^{S0} + y^2_{k-1} + y^2_k, L_{k-2}^{S1} + y^2_{k-1} + (y_{k-1} + 1)^2] \qquad (27)$$

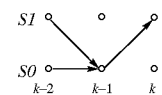

$$\Delta L_k^{S1} = \min[L_{k-2}^{S0} + (y_{k-1} + 1)^2 + y^2_k, L_{k-2}^{S1} + y^2_{k-1} + y^2_k] \qquad (28)$$

3  $0 \leq y_{k-1} + y_k < 1$

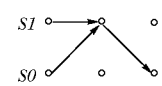

$$\Delta L_k^{S0} = \min[L_{k-2}^{S0} + y^2_{k-1} + y^2_k, L_{k-2}^{S1} + (y_{k-1} - 1)^2 + y^2_k] \qquad (29)$$

-continued $$\Delta L_k^{S1} = \min[L_{k-2}^{S0} + y^2_{k-1} + (y_{k-1} - 1)^2, L_{k-2}^{S1} + y^2_{k-1} + y^2_k] \quad (30)$$

4  $1 \leq y_{k-1} + y_k$ $$\Delta L_k^{S0} = \min[L_{k-2}^{S0} + y^2_{k-1} + y^2_k, L_{k-2}^{S1} + (y_{k-1} - 1)^2 + y^2_k] \quad (31)$$

$$\Delta L_k^{S1} = \min[L_{k-2}^{S0} + y^2_{k-1} + (y_k - 1)^2, L_{k-2}^{S1} + (y_{k-1} - 1)^2 + (y_k - 1)^2] \quad (32)$$

$\Delta L_k^{S0}$ is a metric leading to S0
$\Delta L_k^{S1}$ is a metric leading to S1

Further, for simplifying those expressions (25) to (32), those expressions may be represented as the following expressions (33) to (44) with the foregoing difference metric.

[Expression 10]

1  $y_{k-1} + y_k < -1$

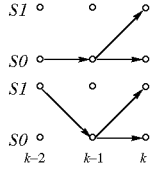

$$\Delta L_k \begin{cases} = -2y_k - 1 & \Delta L_{k-2} > 2y_{k-1} + 1 \quad (33) \\ = -2y_k - 1 & \Delta L_{k-2} \leq 2y_{k-1} + 1 \quad (34) \end{cases}$$

2  $-1 \leq y_{k-1} + y_k < 0$

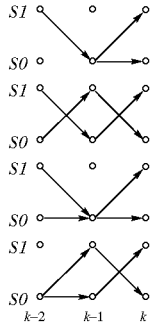

$$\Delta L_k \begin{cases} = -2y_k - 1 & \Delta L_{k-2} \leq 2y_{k-1} + 1, \Delta L_{k-2} < -2y_{k-1} - 1 \quad (35) \\ = \Delta L_{k-2} & 2y_{k-1} + 1 \geq \Delta L_{k-2} \geq -2y_k - 1 \quad (36) \\ = -2y_k + 2y_{k-1} - \Delta L_{k-2} & 2y_{k-1} + 1 < \Delta L_{k-2} < -2y_k - 1 \quad (37) \\ & \text{↳ illegal state} \\ = 2y_{k-1} + 1 & \Delta L_{k-2} > 2y_{k-1} + 1, \Delta L_{k-2} \geq -2y_k - 1 \quad (38) \end{cases}$$

[Expression 11]

3  $0 \leq y_{k-1} + y_k < 1$

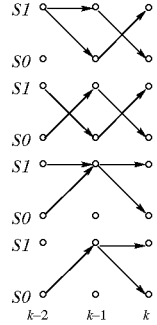

$$\Delta L_k \begin{cases} = -2y_{k-1} - 1 & \Delta L_{k-2} \leq 2y_{k-1} - 1, \Delta L_{k-2} < -2y_k + 1 & (39) \\ = \Delta L_{k-2} & 2y_{k-1} - 1 < \Delta L_{k-2} < -2y_k + 1 & (40) \\ = -2y_{k-1} + 2y_k - \Delta L_{k-2} & 2y_{k-1} - 1 > \Delta L_{k-2} \geq -2y_k + 1 & (41) \\ & \quad\text{↳ illegal state} \\ = -2y_k + 1 & \Delta L_{k-2} > 2y_{k-1} - 1, \Delta L_{k-2} \geq -2y_k + 1 & (42) \end{cases}$$

4  $1 \leq y_{k-1} + y_k$

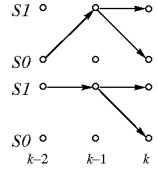

$$\Delta L_k \begin{cases} = -2y_k + 1 & \Delta L_{k-2} > 2y_{k-1} - 1 & (43) \\ = -2y_k + 1 & \Delta L_{k-2} \leq 2y_{k-1} - 1 & (44) \end{cases}$$

operating metric $\Delta L_k = \Delta L_k^{S1} - \Delta L_k^{S0}$

Of the foregoing conditional expressions, it is obvious that the expressions (37) and (41) cannot be provided. The metric between two sampling points may be divided into seven patterns. However, since the circuit is made complicated, the method for simplifying the foregoing circuit may be applied. That is, the variable conversion of the metric into the format of $\Delta L_k = -2y_p + \beta$ results in changing those expressions into the following expressions (45) to (54).

[Expression 12]

| | $\Delta L_k$ | conditional expression | |
|---|---|---|---|
| 1  $y_{k-1} + y_k < -1$ | | | |
| | $-2y_p + \beta = -2y_k - 1$ | $2y_p + 2y_{k-1} < -1 + \beta$ | (45) |
| | $-2y_p + \beta = -2y_k - 1$ | $2y_p + 2y_{k-1} \geq -1 + \beta$ | (46) |
| 2  $-1 \leq y_{k-1} + y_k < 0$ | | | |
| | $-2y_p + \beta = -2y_k - 1$ | $2y_p + 2y_{k-1} \geq -1 + \beta$ $-2y_p + 2y_k < -1 - \beta$ | (47) |
| | $-2y_p + \beta = -2y_p + \beta$ | $2y_p + 2y_{k-1} \geq -1 + \beta$ $-2y_p + 2y_k \geq -1 - \beta$ | (48) |
| | $-2y_p + \beta = 2y_{k-1} + 1$ | $2y_p + 2y_{k-1} < -1 + \beta$ $-2y_p + 2y_k \geq -1 - \beta$ | (49) |

[Expression 13]

| | $\Delta L_k$ | conditional expression | |
|---|---|---|---|
| 3  $0 \leq y_{k-1} + y_k < 1$ | | | |
| S1, S0 (diagram) | $-2y_p + \beta = 2y_{k-1} - 1$ | $2y_p + 2y_{k-1} \geq 1 + \beta$<br>$-2y_p + 2y_k < 1 - \beta$ | (50) |
| S1, S0 (diagram) | $-2y_p + \beta = -2y_p + \beta$ | $2y_p + 2y_{k-1} < 1 + \beta$<br>$-2y_p + 2y_k < 1 - \beta$ | (51) |
| S1, S0 (diagram)<br>$k-2$ $k-1$ $k$ | $-2y_p + \beta = -2y_k + 1$ | $2y_p + 2y_{k-1} < 1 + \beta$<br>$-2y_p + 2y_k \geq 1 - \beta$ | (52) |
| 4  $1 \leq y_{k-1} + y_k$ | | | |
| S1, S0 (diagram) | $-2y_p + \beta = -2y_k + 1$ | $2y_p + 2y_{k-1} < 1 + \beta$ | (53) |
| S1, S0 (diagram)<br>$k-2$ $k-1$ $k$ | $-2y_p + \beta = -2y_k + 1$ | $2y_p + 2y_{k-1} \geq 1 + \beta$ | (54) |

Hence, based on the calculated result of the difference metric, the expressions (45) to (54) are transformed as remarking the new variables yp and β. The transformed results are made to be the expressions (55) to (64).

[Expression 14]

| | $\beta' = 1$ | $\beta' = -1$ | new variable $\beta$ | new variable $y_p$ | | |
|---|---|---|---|---|---|---|
| 1  $y_{k-1} + y_k < -1$ | | | | | | |
| S1, S0 (diagram) | $y_p + y_{k-1} < 1$ | $y_p + y_{k-1} < -1$ | $\beta \to -1$ | $y_p \to y_k$ | (55) | (pattern 1) |
| S1, S0 (diagram)<br>$k-2$ $k-1$ $k$ | $y_p + y_{k-1} \geq 0$ | $y_p + y_{k-1} \geq -1$ | $\beta \to -1$ | $y_p \to y_k$ | (56) | (pattern 2) |
| 2  $-1 \leq y_{k-1} + y_k < 0$ | | | | | | |
| S1, S0 (diagram) | $y_p + y_{k-1} \geq 0$<br>$-y_p + y_k < -1$ | $y_p + y_{k-1} \geq -1$<br>$-y_p + y_k < 0$ | $\beta \to -1$ | $y_p \to y_k$ | (57) | (pattern 2) |
| S1, S0 (diagram) | $y_p + y_{k-1} \geq 0$<br>$-y_p + y_k \geq -1$ | $y_p + y_{k-1} \geq -1$<br>$-y_p + y_k \geq 0$ | $\beta \to \beta$ | $y_p \to y_p$ | (58) | (pattern 4) |
| S1, S0 (diagram)<br>$k-2$ $k-1$ $k$ | $y_p + y_{k-1} < 0$<br>$-y_p + y_k \geq -1$ | $y_p + y_{k-1} < -1$<br>$-y_p + y_k \geq 0$ | $\beta \to +1$ | $y_p \to -y_{k-1}$ | (59) | (pattern 3) |

[Expression 15]

| | $\beta' = 1$ | $\beta' = -1$ | new variable $\beta$ | new variable $y_p$ | | |
|---|---|---|---|---|---|---|
| 3  $0 \leq y_{k-1} + y_k < 1$ | | | | | | |
| (S1, S0 crossing pattern) | $y_p + y_{k-1} \geq 1$<br>$-y_p + y_k < 0$ | $y_p + y_{k-1} \geq 0$<br>$-y_p + y_k < 0$ | $\beta \to -1$ | $y_p \to -y_{k-1}$ | (60) | (pattern 5) |
| (S1, S0 crossing pattern) | $y_p + y_{k-1} < 1$<br>$-y_p + y_k < 0$ | $y_p + y_{k-1} < 0$<br>$-y_p + y_k < 1$ | $\beta \to \beta$ | $y_p \to y_p$ | (61) | (pattern 4) |
| (S1, S0 pattern, k-2 k-1 k) | $y_p + y_{k-1} < 1$<br>$-y_p + y_k \geq 0$ | $y_p + y_{k-1} < 0$<br>$-y_p + y_k \geq 1$ | $\beta \to +1$ | $y_p \to y_k$ | (62) | (pattern 6) |
| 4  $1 \leq y_{k-1} + y_k$ | | | | | | |
| (S1, S0 pattern) | $y_p + y_{k-1} < 1$ | $y_p + y_{k-1} < 0$ | $\beta \to +1$ | $y_p \to y_k$ | (63) | (pattern 6) |
| (S1, S0 pattern, k-2 k-1 k) | $y_p + y_{k-1} \geq 1$ | $y_p + y_{k-1} \geq 0$ | $\beta \to +1$ | $y_p \to y_k$ | (64) | (pattern 7) |

Hence, the algorithm on which the difference metric is calculated is executed to select values to be compared by the two comparators (comparison between yp+yk−1 or −yp+yk and each identification value of ±1 or 0) from an added result of two sampling values yk and yk−1 and one previous β and determine the path from the operational result of these comparators. The resulting transition patterns are made seven.

The data decoding is executed for doing the process of every two pieces of sampling data in determining the path. Hence, the 2-bit decoding has to be done within one clock. Hence, the counters for the path memory and the pointer have to be prepared before and after the flow of operation. Later, each transition pattern will be described.

Figure 10:
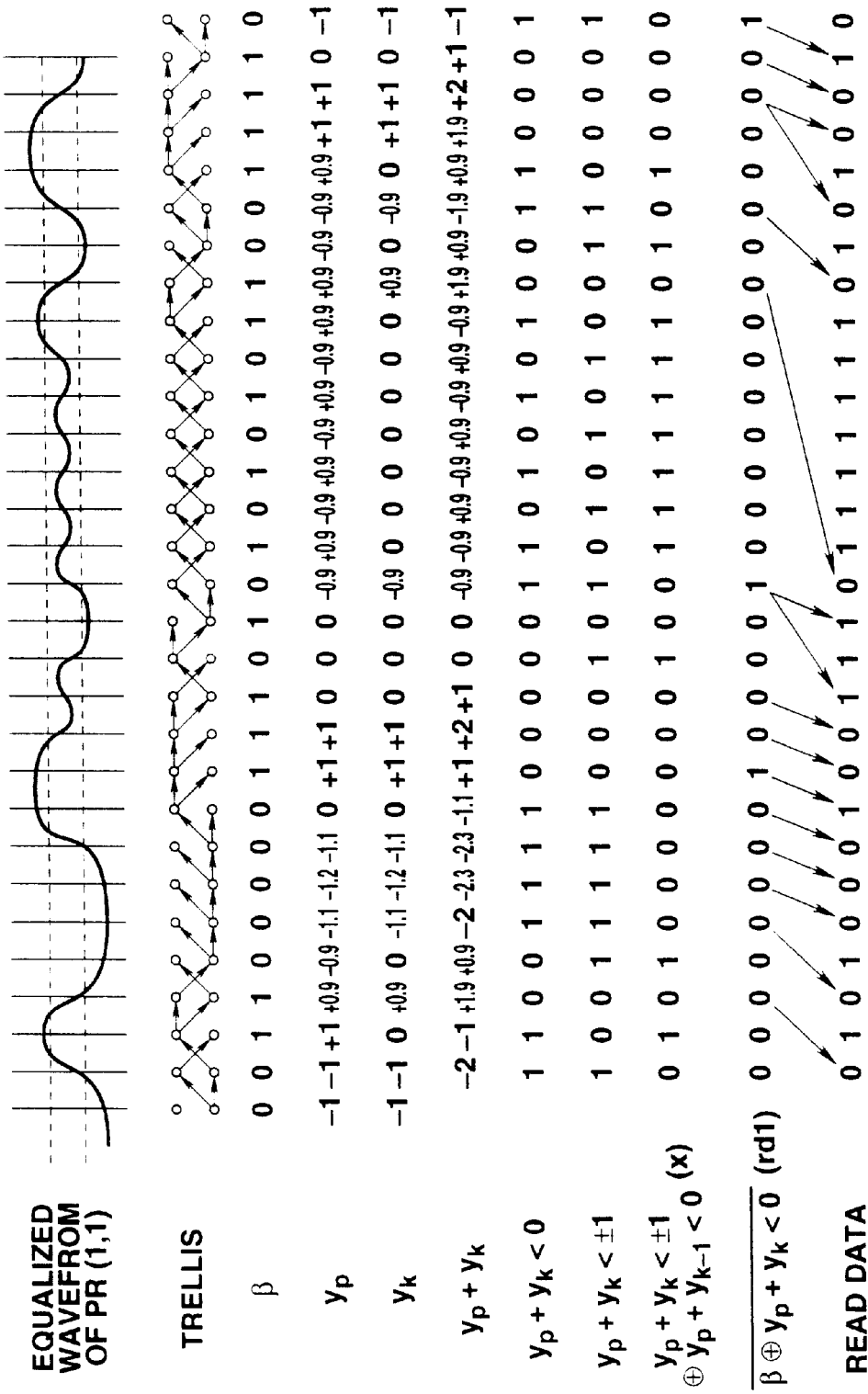
FIG. 10 is a diagram for describing the operation of the Viterbi decoder according to the prior art.

At first, the description will be oriented to pattern1, pattern2, pattern6, and pattern7. These four patterns define the paths at the time points k−2 and k−1, so that the data at the time points k−2 and k−1 are allowed to be decoded. At the time point k−2, this decoded value is derived by the same method as the method for defining the decoded value (reed data rd1) at the time point k−1 described with reference to FIG. 10. That is, from the expression (65), it is understood that the decoded value rde at the time point k−2 is derived by the expressions (66).

[Expression 16]

$$rd1 = \overline{\beta \oplus \boxed{y_p + y_k < 0}} \qquad (65)$$

comparison result of sample value $y_{k-1}$

-continued comparison result of sample value $y_k$

[Expression 17]

$$rde = \overline{\beta \oplus \boxed{y_p + y_{k-1} < 0 \text{ or } y_p + y_{k-1} < \pm 1}} \qquad (66)$$

comparison result of sample value $y_{k-1}$ $$rde = \overline{\beta \oplus \boxed{y_p + y_{k-1} < 0 \text{ or } y_p + y_{k-1} < \pm 1}}$$

comparison result of sample value $y_{k-1}$

The decoded value rdo at the time point k−1 can be calculated after determining the state at the time point k−1 because of defining the path at the time points k−1 and k−2 and determining β' and yp' at the time point k−1 from yk−1 and yk. That is, this calculation is done by the following expression (67). Hence, the decoded value rdo is determined by the expression (68) and is basically the same as the operating expression of the decoded value rde.

[Expression 18]

$$\beta' \to \overline{y_p + y_{k-1} < 0}, y'_p \to y_{k-1} \qquad (67)$$

[Expression 19]

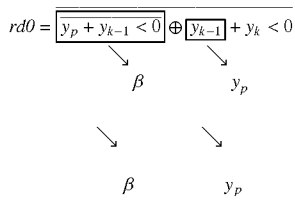

(68)

At this point, the counter for the pointer has a leading pointer ppe=0 and a tail pointer ppo=0.

Next, the description will be oriented to pattern3 and pattern4. These two patterns enable to determine the path of the time point k−2 or earlier but disable to determine the path of the time point k−1. Hence, the data decoding at the time point k−2 is allowed, but the decoding at the time point k−1 is disallowed. However, since the transition pattern at the time point k is a pattern like pattern2 indicated in the expression (12), the decoding at the time point k is allowed. Hence, the decoded value is made to be the foregoing rde at the time point k−2 and a value of "1" at the time point k. The pointers at this time point have a leading point ppe=0 and a tail pointer of ppo=1, because the data is not decoded at the time point k−1. For pattern4, the path is disallowed to be defined at the time points k−2 and k−1. However, since the transition pattern of the path is a pattern like pattern2 indicated in the expression (12), the data is allowed to be decoded at the time points k−1 and k. The decoded values are both "1". The counts of the pointers at this time, that is, both the ppe and the ppo are incremented by 1.

The foregoing description will be summarized as follows, wherein epm denotes a leading path memory, ppe denotes its pointer, opm denotes a tail path memory, and ppo denotes its pointer.

[Expression 20]

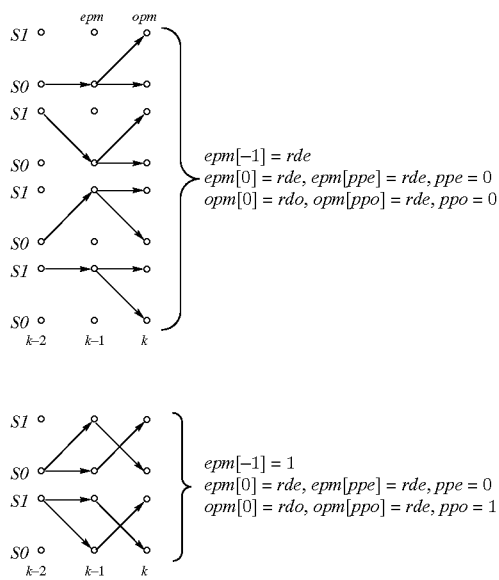

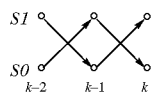

$epm[-1] = 1$
$epm[0] = rde$
$opm[0] = 1$ $ppe = ppe + 1$
$ppo = ppo + 1$

Figure 9:
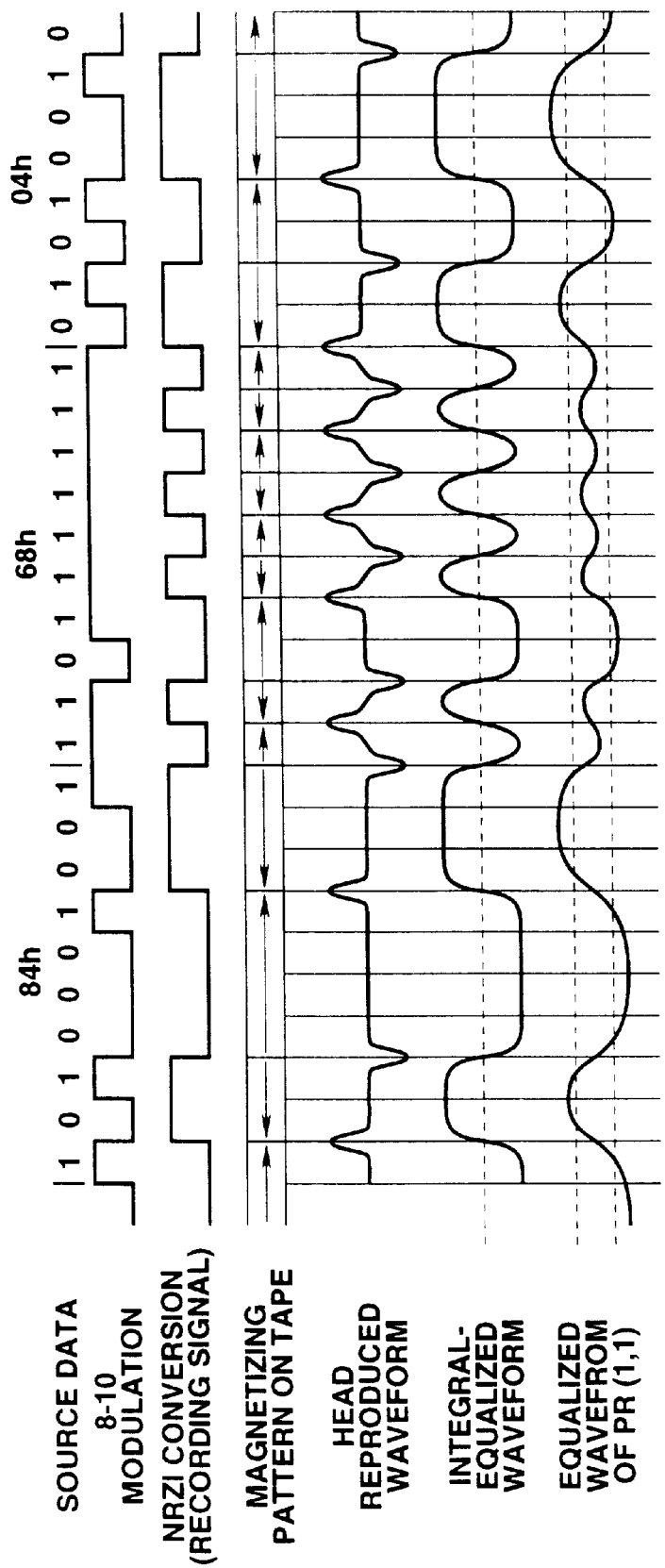
FIG. 9 is a diagram showing waveforms of various parts of the data recording and reproducing apparatus shown in FIG. 4 and a magnetizing pattern on the magnetic tape of the same apparatus.
Figure 11:
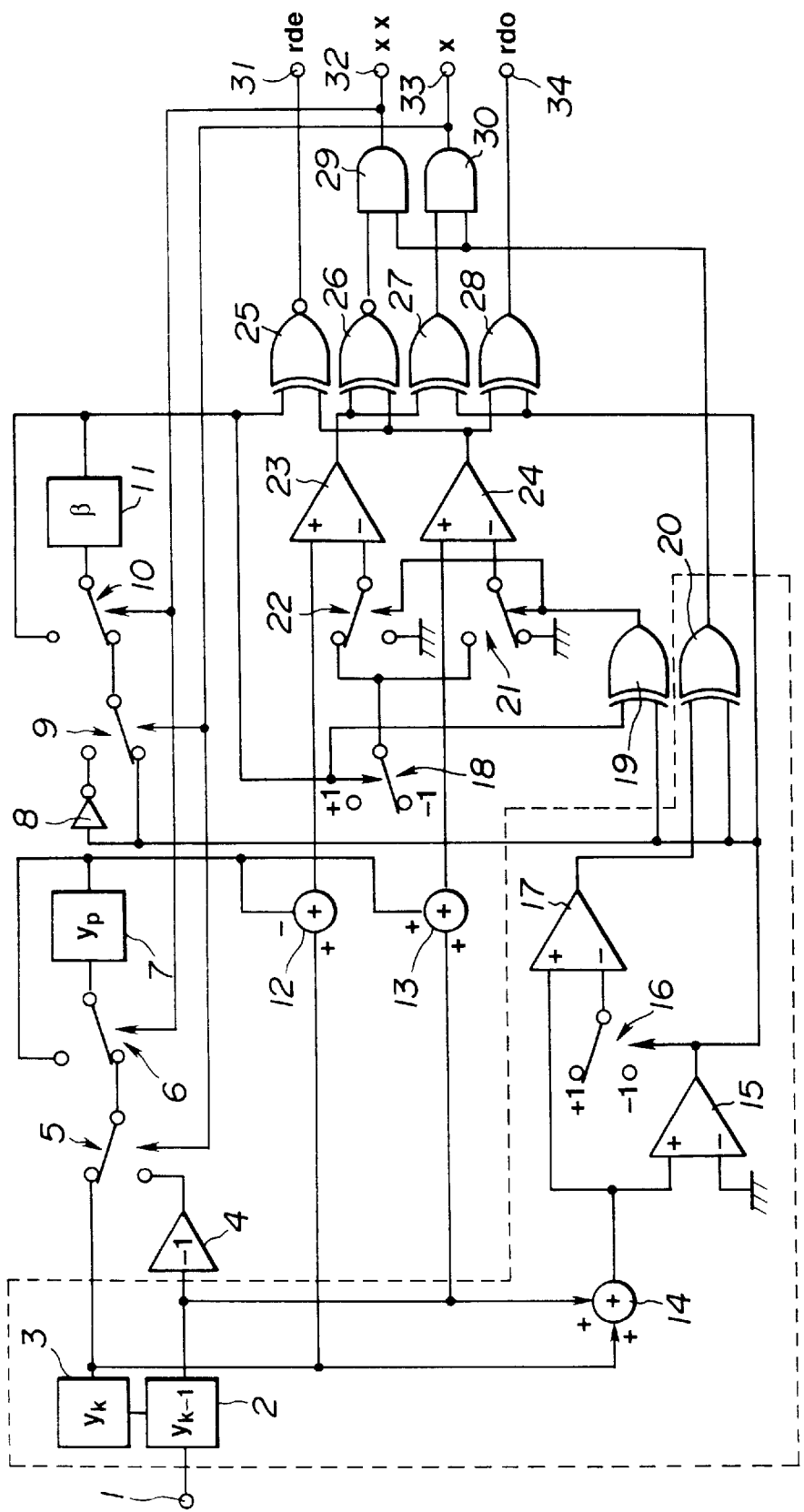
FIG. 11 is a circuit diagram showing an arrangement of a different metric operating unit of the Viterbi decoder according to the present invention.
Figure 12:
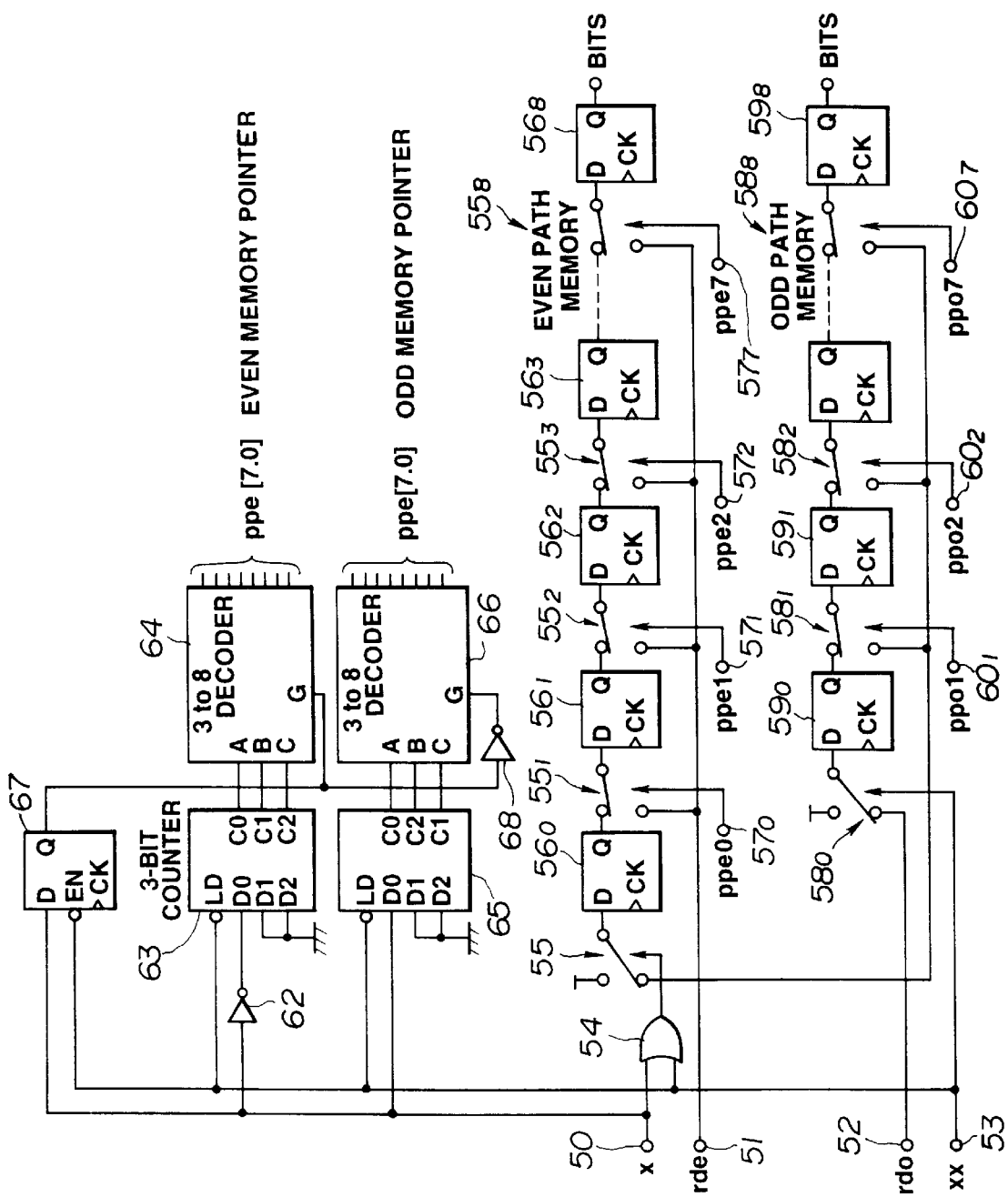
FIG. 12 is a circuit diagram showing an arrangement of a data decoding unit and a path memory provided in the Viterbi decoder according to the present invention.
Figure 13:
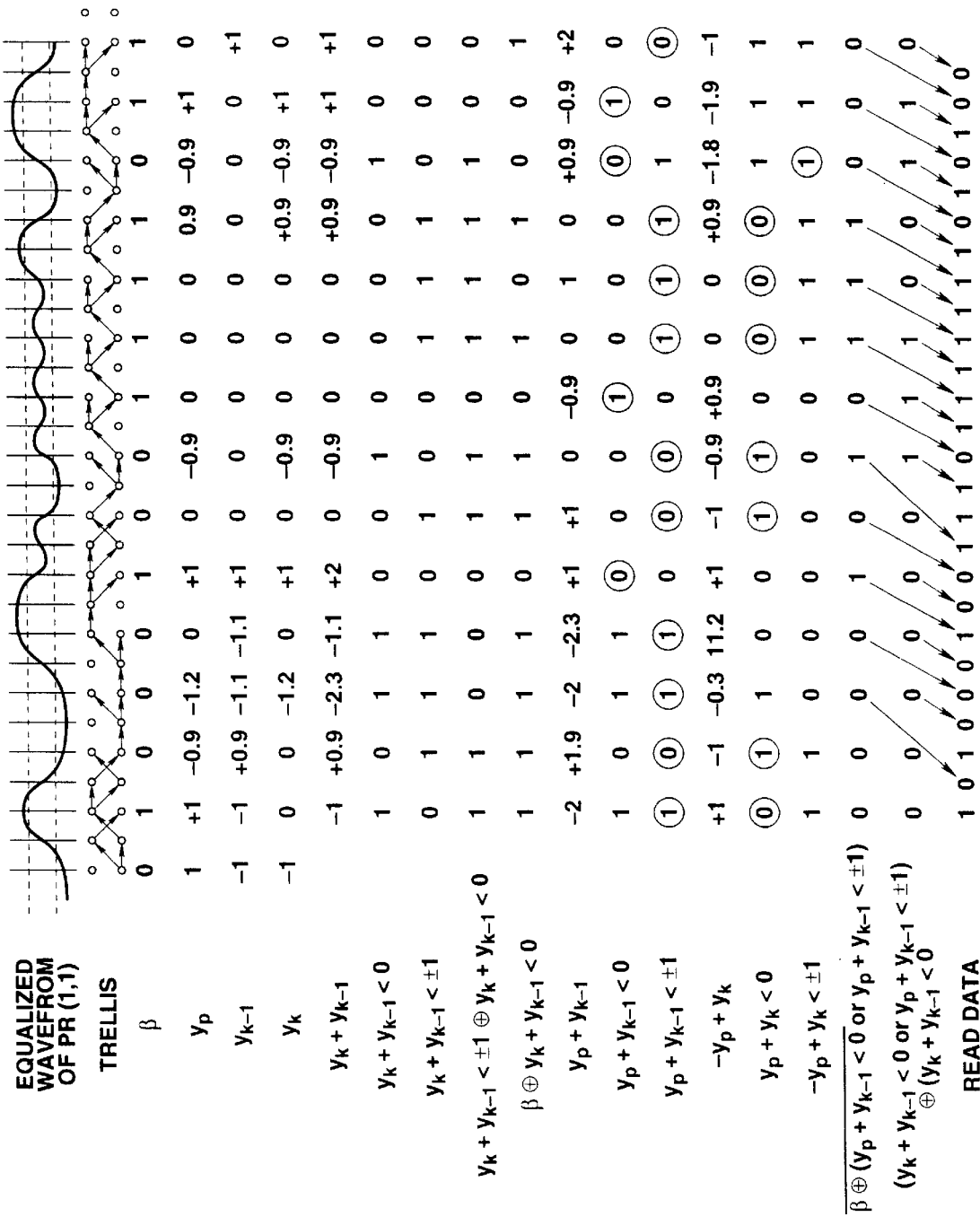
FIG. 13 is a diagram for describing the operation of the Viterbi decoder according to the present invention.

The concrete circuit for realizing the foregoing process may take the arrangements as shown in FIGS. 11 and 12. For example, the arrangement shown in FIG. 1 is served to record the data (source data) in the recording medium 104 as shown in FIG. 9. Then, the data reproduced from the recording medium 104 is decoded. FIG. 13 shows how the Viterbi decoders arranged as shown in FIGS. 11 and 12 are served to decode data.

The difference metric operating unit provided in the Viterbi decoder shown in FIG. 11 has a terminal 1 for receiving a data signal produced by reproducing with a reproduction head a magnetizing pattern as shown in FIG. 9 recorded on the recording medium 104, concretely, a magnetic tape, waveform-equalizing the reproduced pattern by the equalizer 106, and sampling the resulting equalized waveform of PR(1, 1) as shown in FIG. 13 by the sampling circuit 108.

The arrangement shown in FIG. 11 includes: registers 2 and 3 for storing as data yk−1 and yk the data supplied through the terminal 1, the data being produced by sampling the equalized waveform of PR(1, 1) shown in FIG. 13 as mentioned above; an adder 14 for adding the data yk−1 and yk from the registers 2 and 3 to each other; a comparator 15 for comparing the added data of the adder 14 with the identification value of the ground level (0); a comparator 17 for comparing the added data of the adder 14 with an identification value of +1 or −1 selected by a switch 18 according to the output of the comparator 15; and an EXOR circuit 20 for performing an exclusive-OR of the output data from the comparators 17 and 15. The arrangement shown in FIG. 11 includes an adder 13 for adding the data yk−1 from the register 2 to the data yp from the register 7, a comparator 24 for comparing the added data of the adder 13 with the ground level (0) or +1 or −1, a comparator 23 for comparing difference data between the data yk of the register 3 and the data yp of the register 7 with the ground level (0) or +1 or −1, and a logical circuit 26 for performing an exclusive-NOR of the output data from the comparators 23 and 24. The arrangement shown in FIG. 11 includes an EXOR circuit 19 for performing an exclusive-OR of the output data from the comparator 15 and the data β stored in the register 11, an inverter 4 for inverting the output of the register 2, an inverter (NOT circuit) 8 for inverting the output of the comparator 15, switches 5 and 6 for switching the inputs to the register 7, switches 9 and 10 for switching the inputs to the register 11, a switch 18 for setting a reference value of +1 or −1 used for the comparators 23 and 24 according to the data β of the register 11, switches 22 and 21 for setting a reference value of the ground level (0) used for the comparators 23 and 24 according to the output data of the EXOR circuit 19, a logical circuit 25 for performing an exclusive-NOT of the output data from the comparator 24 and the data β of the register 11, an EXOR circuit 27 for performing an exclusive-OR of the output data from the comparators 23 and 15, an EXOR circuit 28 for performing an exclusive-OR of the output data form the comparators 23 and 15, an AND circuit 29 for calculating a logical product of the output data from the logical circuit 26 and the output data of the EXOR circuit 20, and an AND circuit 30 for calculating a logical product of the output data of the EXOR circuit 27 and the EXOR circuit 20. In the initial state, the registers 7 and 11 store predetermined initial values.

That is, the terminal 1 shown in FIG. 11 receives the data produced by sampling the equalized waveform of PR(1, 1) shown in FIG. 13. The data is stored as data yk and yk−1 shown in FIG. 13 in the registers 2 and 3. The data yk and yk−1 of the registers 2 and 3 are added (yk+yk−1) by the adder 14 as shown in FIG. 13.

The output (yk+yk−1) of the adder 14 is compared with the ground level (0) by the comparator 15 as shown in FIG. 13 (yk+yk−1<0). The compared result is output from the comparator 15. As shown in FIG. 13, the output of the adder 14 is compared with a value of +1 or −1 selected by the switch 18 according to the output of the comparator 15 (yk+yk−1<±1). The compared result is output from the comparator 17. The output data from the comparators 15 and 17 are exclusive-ORed by the EXOR circuit 20.

The EXOR circuit 20 offers the exclusive-ORed value of the output of the comparator 17 ("0" or "1" derived from the compared result of yk+yk−1<±1) and the output of the comparator 15 ("0" or "1" derived from the compared result of yk+yk−1<0) as shown in FIG. 13. Then, the exclusive-ORed value is sent to the AND circuits 29 and 30.

The EXOR circuit 19 offers the exclusive-ORed value of the data β from the register 1 and the output of the comparator 15 ("0" or "1" derived from the compared result of yk+yk−1<0) as shown in FIG. 13. The exclusive-ORed value is sent as the switch control signals to the switches 21 and 22.

On the other hand, the data yk−1 of the register 2 is added to the data yp of the register 7 by the adder 13 as shown in FIG. 13. The added output (yp+yk−1) is sent to the comparator 24. This comparator 24 operates to compare the ground level (0) selected by the switch 21 according to the output data of the EXOR circuit 19 with the added output (yp+yk−1) of the adder 13 (yp+Yk−1<0) or compare a value of +1 or −1 selected by the switches 13 and 21 according to the data β of the register 11 and the output data of the EXOR circuit 19 with the added output (yp+yk−1) of the adder (yp+yk−1<±1). The compared result is output from the comparator 24.

As shown in FIG. 13, the data yk of the register 3 is subtracted from the data yp of the register 7 by the subtracter 12 (−yp+yk). This subtracted output (−yp+yk) is sent to the comparator 23. This comparator 23 operates to compare the ground level (0) selected by the switch 22 according to the output data of the EXOR circuit 19 with the subtracted output (−yp+yk) of the subtracter 12 (−yp+yk<0) or a value of +1 or −1 selected by the switches 18 and 22 according to the data β of the register 11 and the output data of the EXOR circuit 19 with the subtracted output (−yp+yk) of the subtracter 12 (−yp+yk<±1). The compared result is output from the comparator 23.

The output of the comparator 23 (the compared result of −yp+yk<0 or −yp+yk<±1) and the output of the comparator 24 (the compared result of yp+yk−1<0 or yp+yk−1<±1) are exclusive-NORed by the logical circuit 26. The result is ANDed with the output of the EXOR circuit 20 by the AND circuit 29. The resulting data is output as data xx at the terminal 32.

The EXOR circuit 27 takes an exclusive-OR of the output of the comparator (the compared result of −yp+yk<0 or −yp+yk<±1) and the output of the comparator 15 (the compared result of yk+yk−1<0) as shown in FIG. 13. The exclusive-ORed value is ANDed with the output of the EXOR circuit 20 by the AND circuit 30, and the result is output as data x at the terminal 33.

Further, the EXOR circuit 28 takes an exclusive-OR of the output of the comparator 24 (the compared result of yp+yk−1<0 or yp+yk−1<±1) and the output of the comparator 15 (the compared result of yk+yk−1<0) as shown in FIG. 13. The exclusive-ORed result is output as reed data rdo at the terminal 34.

The logical circuit 25 takes an exclusive-NOT of the output of the comparator 24 (the compared result of yp+yk−1<0 or yp+yk−1<±1) and the data β of the register 11 as shown in FIG. 13. The result is output as reed data rde at the terminal 31.

The switch 5 is served to select any one of the data yk−1 from the register 2 inverted by the inverter 4 according to the data x from the AND circuit 30 and the data yk from the register 3. The switch 6 is served to select any one of the output of the switch 5 and the data yp stored in the register 7. The output of the switch 6 is stored as data yp in the register 7.

The switch 9 is served to select any one of the output data (the compared result of yk+yk−1<0) from the comparator 15 and the data of the comparator 15 inverted by the inverter 8. The switch 10 is served to select any one of the output of the switch 9 and the data β stored in the register 11 according to the data xx from the AND circuit 29. The output of the switch 10 is stored as data β in the register 11.

Figure 2:
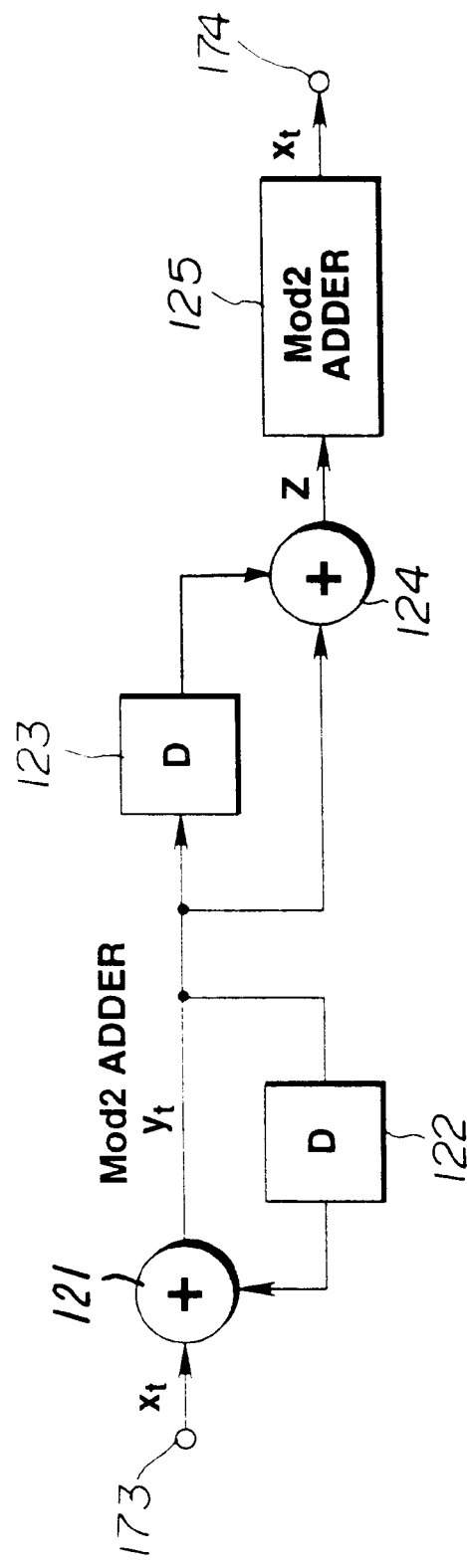
FIG. 2 is a block diagram showing an arrangement of a data recording and reproducing apparatus to which a partial response (1, 1) is applied.
Figure 3:
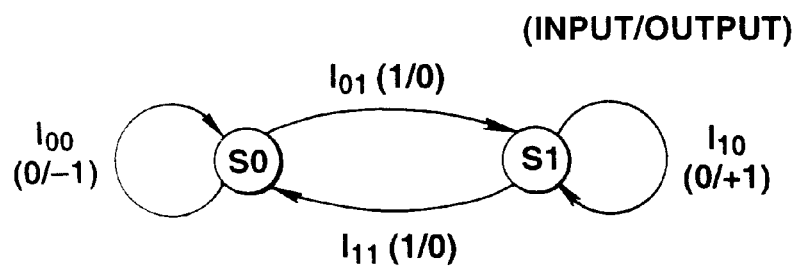
FIG. 3 is a diagram showing a state transition of the partial response (1, 1)
Figure 4:
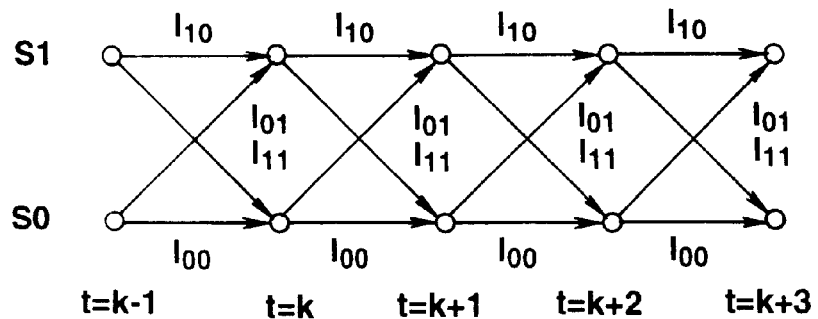
FIG. 4 is a Trellis diagram showing the partial response (1, 1)
Figure 5:
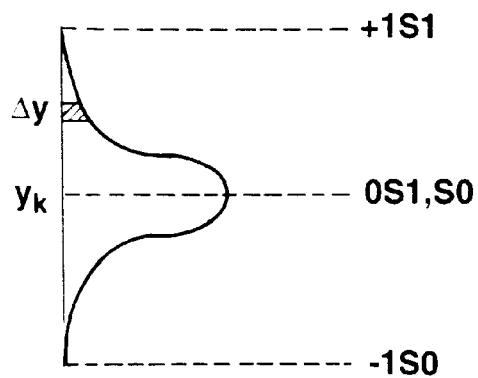
FIG. 5 is a diagram showing a reproduced distribution of the partial response (1, 1)
Figure 6:
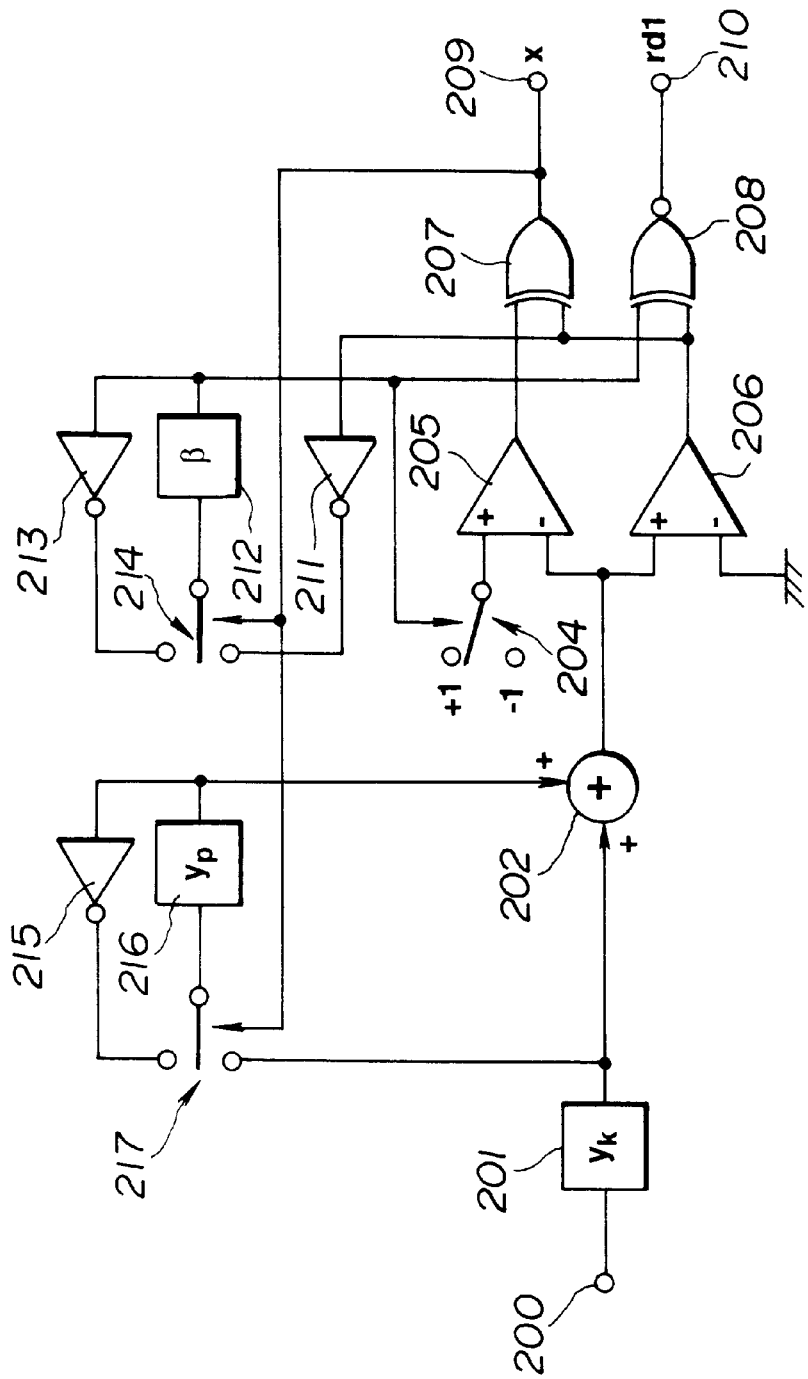
FIG. 6 is a circuit diagram showing an arrangement of the difference metric unit of the Viterbi decoder according to the prior art.
Figure 7:
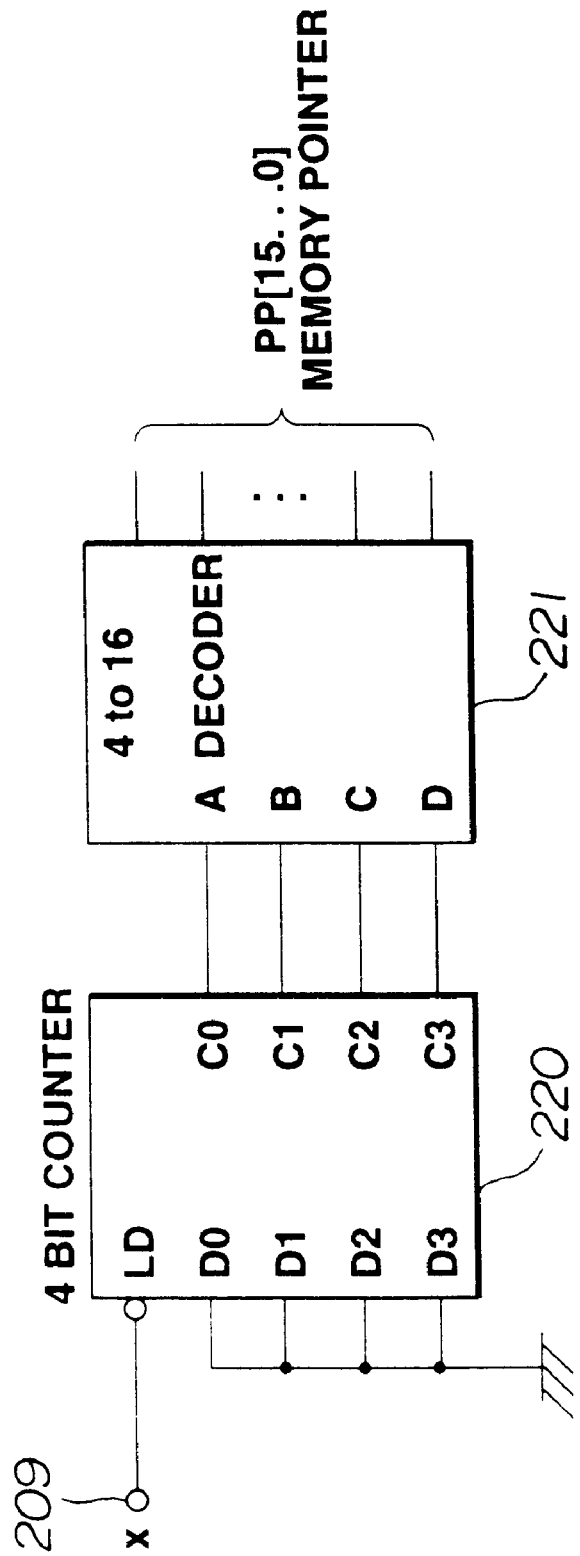
FIG. 7 is a circuit diagram showing an arrangement of a data decoding unit according to the prior art.
Figure 8:
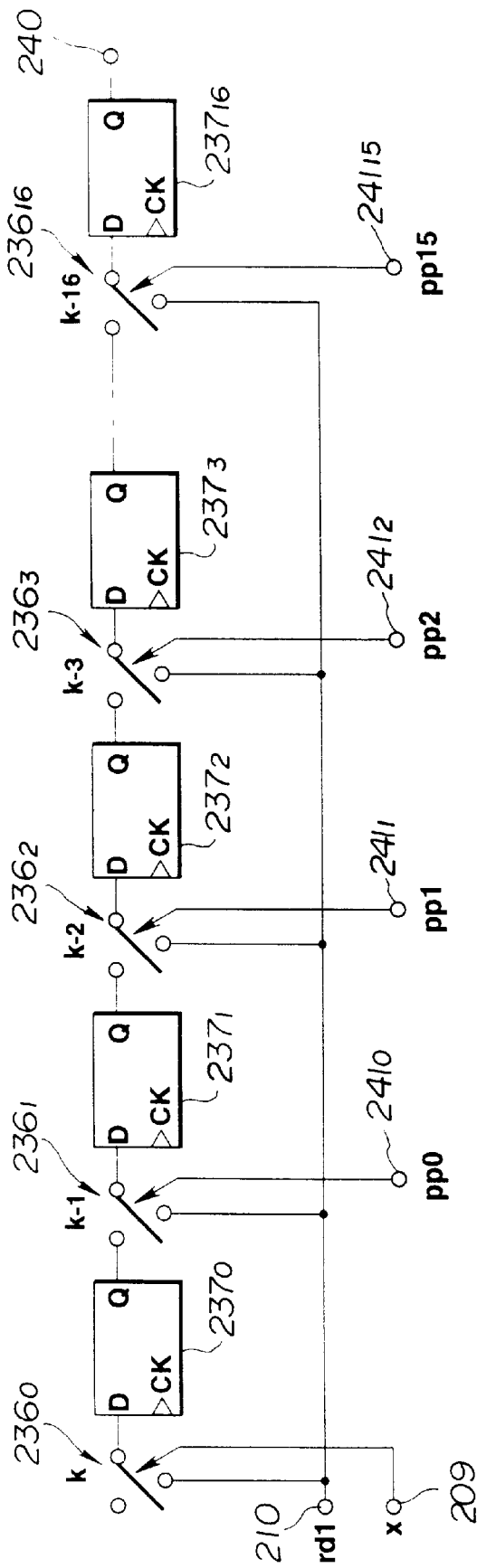
FIG. 8 is a circuit diagram showing a concrete arrangement of a path memory according to the prior art.

Next, the data x output at the terminal 33 of FIG. 11 is supplied to the terminal 50 of FIG. 12. The reed data rdc output at the terminal 31 of FIG. 11 is supplied to the terminal 51 of FIG. 12. The reed data rdo output at the terminal 34 of FIG. 11 is supplied to the terminal 52 of FIG. 2. The data xx output at the terminal 33 of FIG. 11 is supplied to the terminal 53 of FIG. 12.

The data x entered to the terminal 50 is supplied to the input terminal of a 3-bit counter 65. The data x is also inverted by the inverter 62 and applied to the input terminal of the 3-bit counter 63. The data xx supplied to the terminal 53 is the load terminals of the 3-bit counters 63 and 65.

The 3-bit output from the 3-bit counter 63 is decoded into an 8-bit signal by the decoder 64 and then output the 8-bit signal as the pointer data $ppe0$ to $ppe7$ of an even path memory. The 3-bit output from the 3-bit counter 65 is decoded into an 8-bit signal by the decoder 66 and then output the 8-bit signal as the pointer data $ppo0$ to $ppo7$ of an odd path memory.

That is, the inverter 62, the 3-bit counters 63 and 65, and the decoders 64 and 66 compose the data decoding unit of the Viterbi decoder.

In the arrangement shown in FIG. 12, the path memory includes nine flip-flops $56_0$ to $56_8$ and the other nine flip-flops $59_0$ to $59_8$. These flip-flops $56_0$ to $56_8$ receive the ORed output of the data xx and the data x given by the OR circuit 54 or the data supplied from the decoder 64 through the terminals $57_0$ to $57_7$ as being switched by the switches $55_0$ to $55_8$ according to the pointer data $ppe0$ to $ppe7$ of the even path memory. The flip-flops $59_0$ to $59_8$ receive the data xx or the data supplied through the terminals $60_1$ to $60_7$ from the decoder 66 as being switched by the switches $58_0$ to $58_8$ according to the pointer data $ppo0$ to $ppo7$ of the odd path memory. Further, a flip-flop 67 is provided for receiving the data xx as an enable signal and alternately operating the decoders 64 and 66 on the data x. The decoder 66 has a ground terminal G which is connected to the output of the flip-flop 67 through the inverter 68.

Comparing the arrangement of the Viterbi decoder according to the present invention with that of the Viterbi decoder according to the prior art, the arrangement according to the present invention operates to process the data for two sampling points at a batch and thereby make a clock rate half as low as the arrangement of the prior art which operates to process the data for each one sampling point at a time.

That is, the normal Viterbi decoder provides a peculiar loop called the ACS loop. The operation inside of this loop has to be terminated in one time point throttle, which is a critical path for limiting the information speed. On the other hand, the Viterbi decoder of the present invention is arranged to perform plural operations within one loop though the Viterbi decoder of the prior art has been arranged to perform just one operation within one loop in one time point throttle. Hence, the Viterbi decoder of this invention allows a longer time point taken in performing one operation for a portion of the ACS loop existing in the decoder, thereby making the upper limit of the operating speed of the Viterbi decoder higher. This results in making it possible for the present invention to perform the information recording or transmission at a faster speed than the prior art.

The portion enclosed by a dotted line of FIG. 11 is not incorporated in the loop. The operation for this portion may be cut once by locating the flop-flops. The critical path inside of the loop offers the substantial same gate delaying amount as the conventional arrangement. Hence, the present invention can offer about twice as high an information speed (transfer rate) as the prior art.

The present invention provides as hardware twice as many comparators, adders and counters for the path memory as the prior art. In actual, the techniques such as a logical synthesis allow the circuits to be shared by one another, thereby suppressing the increase of the hardware amount to about thirty percents.

Conversely, if the present invention is compared with the prior art at the same information speed, though the present invention provides in circuit scale thirty percents lager than the prior art, the invention reduces its operating clock to a half as compared with the prior art and thus is advantageous in power consumption.

That is, the increase of the hardware amount caused by the operations within one loop complicated because of enhancing the operating speed is allowed to be remarkably suppressed as compared with the enhancement of the operating speed. If the present invention uses the information speed which is the same as the prior art, the operating speed of the loop portion is allowed to be reduced, which leads to lowering the power consumption and thereby facilitating the mounting of the loop on the LSI.

The present invention may be embodied in other specific forms without departing from the spirit or essential characteristics thereof. The present embodiment is therefore to be considered in all respects as illustrative and not restrictive, the scope of the present invention being indicated by the appended claims rather than by the foregoing description and all changes which come within the meaning and range of equivalency of the claims are therefore intended to be embraced therein.

What is claimed is:

1. A Viterbi decoding method for determining the most approximate path on two-state state metrics for decoding data, comprising the steps of:

reading sample data of even-numbered sampling points;

storing the read sample data as respective pairs, each pair being formed from two consecutive even-numbered sampling points;

determining a state transition between sampling points in each of said respective pairs as a function of at least respective even-numbered sampling points and a preselected identification value; and determining a path leading to a state of a respective sampling point in each pair on the basis of the determined state transition.

2. The Viterbi decoding method as claimed in claim 1, further comprising deriving a difference metric at said respective sampling point based on a previous state of said respective sampling point and a current state of said respective point.

3. A Viterbi decoder for determining the most approximate path on two-state state metrics for decoding data, comprising:

means for reading sample data of even-numbered sampling points;

means for storing the read sample data as respective pairs, each pair being formed from two consecutive even-numbered sampling points; and means for determining a state transition path for a sampling point in each of said respective pairs as a function of at least respective even-numbered sampling points and a preselected identification value.

4. The Viterbi decoder as claimed in claim 3, further comprising means for adding the read sample data of a sampling point and of a consecutive sampling point in each of said respective pairs, means for comparing the added sample data to said identification value, and means for supplying first and second decoded data of said points.

5. The Viterbi decoder as claimed in claim 4, wherein said means for determining includes an odd path memory comprising a number of flip-flops for sequentially receiving said first decoded data, an even path memory comprising a number of flip-flops for sequentially receiving said second decoded data, and first and second counters for generating pointer data for selectively entering the first and second decoded data, respectively, to each of said flip-flops.

6. Apparatus for reproducing information from a signal containing modulated/coded data representing said information, comprising:

means for receiving said signal and obtaining the modulated/coded data from the received signal;

a Viterbi decoder for determining the most approximate path on two-state state metrics for decoding the modulated/coded data, said Viterbi decoder including:

means for reading sample data of even-numbered sampling points;

means for storing the read sample data as respective pairs, each pair being formed from two consecutive even-numbered sampling points; and means for determining a state transition path for a sampling point in each of said respective pairs as a function of at least respective even-numbered sampling points and a preselected identification value; and a demodulator for demodulating the decoded data to reproduce said information.

7. The apparatus according to claim 6, further comprising a sampling circuit for sampling the received signal at a predetermined rate to obtain the modulated/coded data if said signal is analog.

8. Apparatus for transmitting and receiving data, comprising:

a modulator for modulating data;

a coder for coding the modulated data for transmission via a transmission medium;

a receiver for receiving the coded data;

a sampling circuit for sampling the received data at a predetermined rate to obtain the coded data;

a decoder for determining the most approximate path on two-state state metrics for decoding the coded data to obtain the modulated data, said decoder including:

means for reading sample data of even-numbered sampling points;

means for storing the read sample data as respective pairs, each pair being formed from two consecutive even-numbered sampling points; and means for determining a state transition path for a sampling point in each of said respective pairs as a function of at least respective even-numbered sampling points and a preselected identification value; and a demodulator for demodulating the modulated data to reproduce said data prior to modulation.

* * * * *